US008451639B2

(12) United States Patent
Revak

(10) Patent No.: US 8,451,639 B2
(45) Date of Patent: May 28, 2013

(54) AUTOMATIC VOLTAGE SELECTOR CONTROL CIRCUIT FOR TEST SETS WITH TAP SELECTABLE LINE INPUT TRANSFORMERS

(75) Inventor: Christopher J. Revak, Pleasanton, CA (US)

(73) Assignee: Electrical REliability Services, Inc., San Ramon, CA (US)

( * ) Notice: Subject to any disclaimer, the term of this patent is extended or adjusted under 35 U.S.C. 154(b) by 638 days.

(21) Appl. No.: 12/658,869

(22) Filed: Feb. 16, 2010

(65) Prior Publication Data

US 2011/0199067 A1 Aug. 18, 2011

(51) Int. Cl.
*H02M 1/10* (2006.01)
*G05F 1/14* (2006.01)

(52) U.S. Cl.
USPC .......... 363/142; 323/255

(58) Field of Classification Search
USPC .......... 363/142, 143; 323/255–257
See application file for complete search history.

(56) References Cited

U.S. PATENT DOCUMENTS

| | | | | |
|---|---|---|---|---|
| 4,780,805 | A * | 10/1988 | Chewuk et al. | 363/142 |
| 5,272,313 | A * | 12/1993 | Karino et al. | 219/130.21 |
| 5,602,462 | A * | 2/1997 | Stich et al. | 323/258 |
| 5,932,997 | A * | 8/1999 | James | 323/351 |
| 6,108,226 | A * | 8/2000 | Ghosh et al. | 363/142 |
| 8,049,373 | B2 * | 11/2011 | Ishikawa | 307/130 |

* cited by examiner

*Primary Examiner* — Jessica Han
(74) *Attorney, Agent, or Firm* — Kinney & Lange, P.A.

(57) ABSTRACT

An input adaptable electrical test set provides for the automatic detection of the power source connected to the test set, as well as automatic configuration of the test set to accommodate the identified power source. Prior to identification of the power source, a circuit breaker isolates a main transformer associated with the test set from receiving power from the power source. The main transformer includes a primary winding and a secondary winding, the primary winding having first, second and third tap positions that allows the transformer to be configured in one of two states depending on the power source connected to the test set. An automatic input voltage detection circuit monitors the input voltage provided by the unidentified power source and identifies the power source based on the monitored voltage. Based on the identification of the power source, the automatic input voltage detection circuit selects the configuration of the main transformer and the circuit breaker is closed to allow power from the power source to be supplied to the main transformer.

9 Claims, 2 Drawing Sheets

20
TO RELAY 22b
TO INDICATOR 24b
TO RELAY 22a
TO INDICATOR 24a
GND
STEPPED DOWN INPUT VOLTAGE
GND
RELAY
42a
RELAY
42b
DC TO DC CONVERTER
32
UNIVERSAL POWER SUPPLY
30
34
36
R1
R2
C1
C2
38
D1
D2
R5
TIMER
44
C3
WINDOW COMPARATOR
40
R3
R4
Q1
Q2

AUTOMATIC VOLTAGE SELECTOR CONTROL CIRCUIT FOR TEST SETS WITH TAP SELECTABLE LINE INPUT TRANSFORMERS

BACKGROUND

The present invention is related to electrical test equipment, and in particular to input adaptable test equipment.

Electrical test equipment, and in particular portable test equipment, is designed to be connected to various power sources (e.g., 208 volt alternating current (VAC) or 480 VAC). In this way, a single piece of test equipment may be employed despite the power source available in a particular environment.

However, to operate correctly, prior art input adaptable test equipment requires a user to correctly identify the power source and manually modify the test equipment to receive the identified power source. Mistakes in identifying the power source and in modifying the test equipment result in the test equipment either not working properly or in failure and damage to the test equipment.

SUMMARY

An input adaptable electrical device provides automatic adaptability to different types of power sources. The device includes an input, a main transformer, a circuit breaker, and an automatic input voltage detection circuit. The input is for connecting the electrical device to an unidentified power source. The transformer includes a primary winding and a secondary winding. The primary winding of the transformer is connected through the circuit breaker to the input, and includes three tap positions that allow the transformer to be configured in a first or second state. The automatic input voltage detection circuit monitors the input voltage provided by the unidentified power source and identifies the power source based on the monitored voltage. Based on the identification of the power source, the automatic input voltage detection circuit selects the configuration of the main transformer and the circuit breaker is closed to allow power from the power source to be supplied to the main transformer.

DETAILED DESCRIPTION

The present invention provides an input adaptable test circuit for connection to various, potentially unknown power sources. The test circuit includes a transformer having a plurality of tap positions that allows the transformer to be configured to accommodate an identified power source. An automatic voltage comparator circuit monitors the voltage provided by the power source prior to the power source supplying voltage to the transformer. The auto-voltage comparator circuit identifies the power source and in response selects the tapped position of the transformer. Subsequently, the voltage provided by the power source is provided to the transformer and the test circuit begins operation based on the output generated by the correctly configured transformer.

Figure 1:
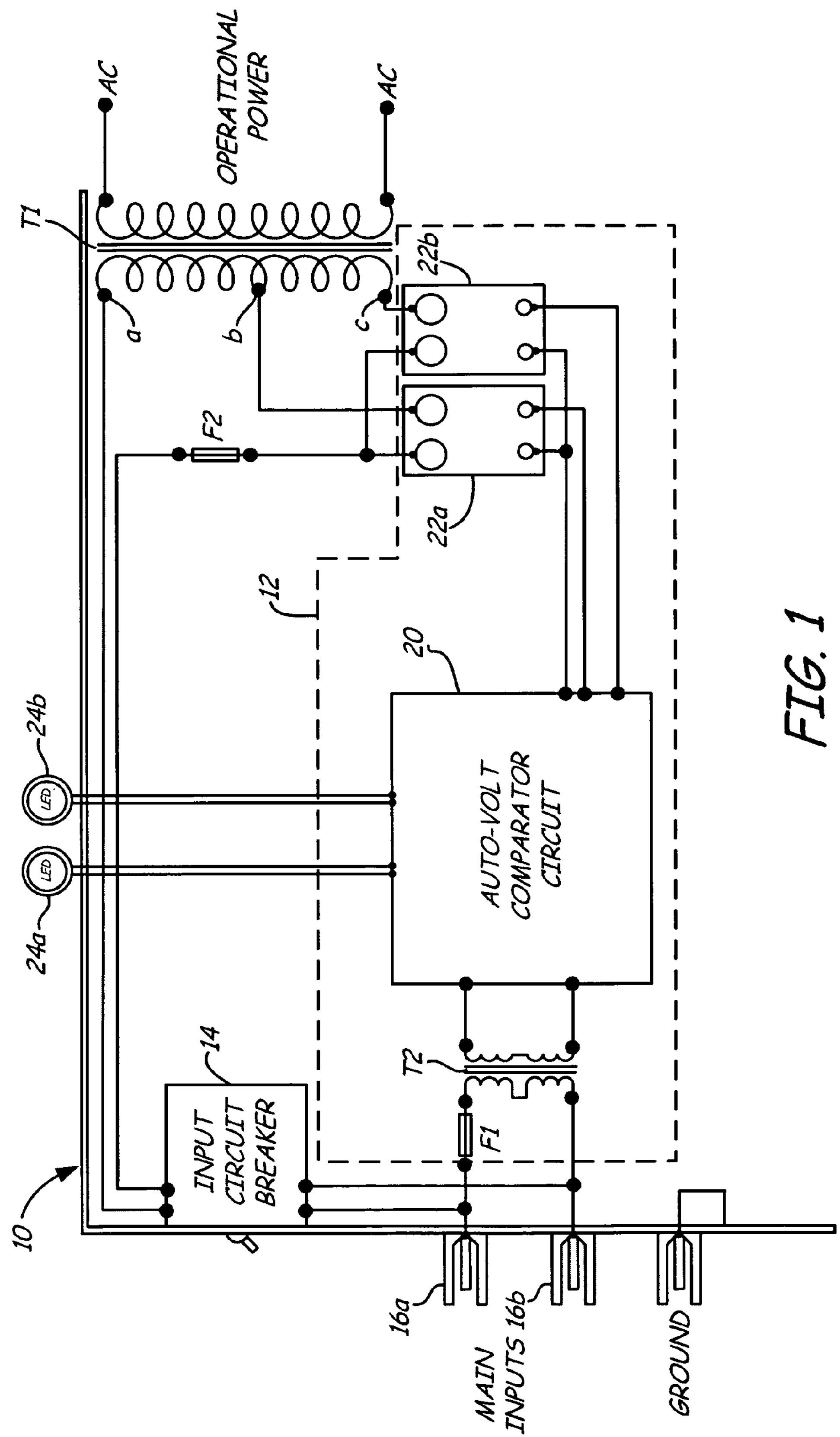
FIG. 1 is a circuit/block diagram of an input adaptable test set having an automatic input voltage detection circuit according to an embodiment of the present invention.

FIG. 1 is a block/circuit diagram of input adaptable test set 10 according to an embodiment of the present invention. Input adaptable test set 10 includes automatic input voltage detection circuit 12, circuit breaker 14, inputs 16*a* and 16*b*, fuses F1 and F2, and main transformer T1 which includes taps 'a', 'b' and 'c'. Automatic input voltage detection circuit 12 includes step-down transformer T2, auto-volt comparator circuit 20, relays 22*a* and 22*b*, and visual indicators 24*a* and 24*b*.

Inputs 16*a* and 16*b* are connectable to receive power from a power source. Power provided at inputs 16*a* and 16*b* is provided to circuit breaker 14 and to a primary side of step-down transformer T2. At the time of connection to the power source, the identity of the power source may be unknown, and main transformer T1 may not be configured properly to receive the voltage provided by the power source. To isolate main transformer T1 from the voltage source, circuit breaker 14 is maintained in the 'open' or 'off' position to prevent power from inputs 16*a* and 16*b* from being provided to the primary side of main transformer T1. In this embodiment, circuit breaker 14 is manually operated by a switch provided on the outside of test set 10, although in other embodiments circuit breaker 14 may be automatically activated by automatic input voltage detection circuit 12 subsequent to identification of the power source and proper configuration of main transformer T1. In the 'closed' position, circuit breaker 14 provides the voltage provided at input terminals 16*a* and 16*b* to the primary side of transformer T1. The voltage provided at the primary side of transformer T1 generates an AC output voltage on the secondary side of transformer T1 that provides the operational power required by test set 10.

Prior to circuit breaker 14 supplying power to the primary side of main transformer T1, automatic input voltage detection circuit 12 operates to identify the power source connected to inputs 16*a* and 16*b* and to automatically select the correct tapped position of main transformer T1. In the embodiment shown in FIG. 1, step-down transformer T2 steps down the input voltage provided at the primary side of the transformer and provides isolation between inputs 16*a*, 16*b* and auto-volt comparator circuit 20. The stepped-down voltage provided by step-down transformer T2 provides operational power to auto-volt comparator circuit 20. In addition, auto-volt comparator circuit 20 samples the stepped-down voltage (which is proportional to voltage provided at inputs 16*a* and 16*b* by the unknown power source) to identify the power source connected to test set 10. Based on the identified voltage, auto-volt comparator circuit 20 selectively energizes either relay 22*a* or relay 22*b* to select the tapped position of main transformer T1. In one embodiment, relays 22*a* and 22*b* are normally open, single pole/single throw relays to ensure that if one of the relays fails, it remains in the 'open' state to prevent the wrong transformer tap from being selected.

In the embodiment shown in FIG. 1, relay 22*a* is connected to receive an energizing input from auto-volt comparator circuit 20, and is connected between fuse F2 and a middle tap 'b' of input transformer T2. Energizing relay 22*a* causes the voltage provided at input 16*a* and 16*b* to be provided across the primary winding of main transformer T1 from tap 'a' to tap 'b'. Relay 22*b* is similarly connected to receive an energizing input from auto-volt comparator circuit 20, but is connected between fuse F2 and end tap 'c' of input transformer T2. As such, energizing relay 22*b* causes the voltage provided at input 16*a* and 16*b* to be provided across the primary winding of main transformer T1 from tap 'a' to tap 'c'. In this embodiment, relay 22*a* is energized in response to auto-volt comparator circuit 20 identifying the power source as 208

VAC and relay 22*b* is energized in response to auto-volt comparator circuit 20 identifying the power source as 480 VAC.

In the embodiment shown in FIG. 1, auto-volt comparator circuit 20 also generates an output to activate a visual indicator (e.g., visual indicators 24*a*, 24*b*) in response to the detected voltage. The visual indicators notify persons operating the equipment that the input voltage has been detected. In the embodiment shown in FIG. 1, visual indicators 24*a* and 24*b* indicate not only that the input voltage has been detected, but the magnitude of the detected input voltage (e.g., visual indicator 24*a* indicates 208 VAC and visual indicator 24*b* indicates 480 VAC).

Operation of input adaptable test set 10 begins with personnel connecting a power source (potentially of unknown voltage) to inputs 16*a* and 16*b*. Initially, circuit breaker 14 is in the 'open' or 'off' position to prevent power supplied at inputs 16*a* and 16*b* from being provided to main transformer T1. The power provided at inputs 16*a* and 16*b* is supplied through step-down transformer T2 to auto-volt comparator circuit 20. The magnitude of the supplied voltage is determined by auto-volt comparator circuit 20, and based on the determined voltage, auto-volt comparator circuit 20 energizes relay 22*a* or 22*b* to select the tapped position of main transformer T1. Having automatically selected the tapped position of main transformer T1, visual indicator 24*a* or 24*b* is activated by auto-volt comparator circuit 20, indicating to the user that input adaptable test set 10 is ready for operation. The user 'closes' or turns 'on' circuit breaker 14, allowing power provided at input terminals 16*a*, 16*b* to be supplied to main transformer T1.

Figure 2:
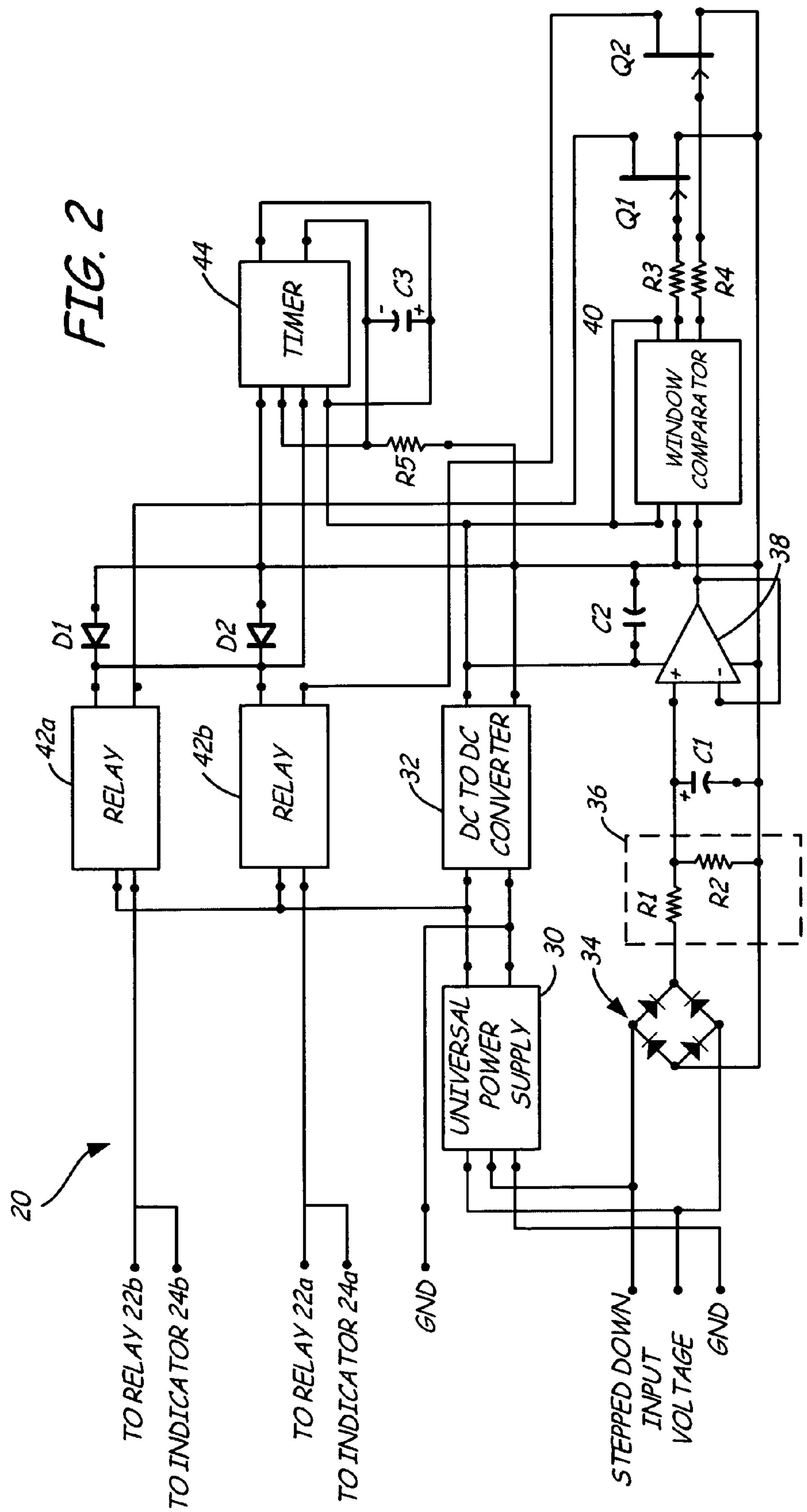
FIG. 2 is a circuit diagram of the automatic input voltage detection circuit according to an embodiment of the present invention.

FIG. 2 is a circuit diagram of auto-volt comparator circuit 20 according to an embodiment of the present invention. In the embodiment shown in FIG. 2, comparator circuit 20 includes universal power supply 30, DC-to-DC converter 32, bridge rectifier 34, voltage divider 36, buffer circuit 38, window comparator circuit 40, relays 42*a* and 42*b*, transistors Q1 and Q2, timer circuit 44, resistors R1, R2, R3, R4, and R5, diodes D1 and D2, and capacitors C1, C2, and C3. Auto-volt comparator circuit 20 receives input from step-down transformer T2, labeled 'Stepped-down input voltage'. In response to these inputs, auto-volt comparator circuit 20 generates outputs to selectively energize relay 22*a* or 22*b* (as shown in FIG. 1) and to selectively activate visual display 24*a* or 24*b* (also shown in FIG. 1).

The stepped-down voltage provided as an input to auto-volt comparator circuit 20 is provided to universal power supply circuit 30. The input range of universal power supply circuit 30 is large (e.g., 90V-265V) to accommodate various inputs depending on the type of power supply connected to input adaptable test set 10 (shown in FIG. 1). That is, despite various AC voltages being provided to universal power supply circuit 30, a steady, constant DC output voltage is generated as an output (e.g., 12V). In the embodiment shown in FIG. 2, the output of universal power supply circuit 40 provides power to normally-open contacts of relays 42*a* and 42*b*. Thus, when relay 42*a* or relay 42*b* is energized, the voltage (e.g. 12V) provided by universal power supply circuit 40 is supplied to an output terminal connected to energize relay 22*a* or 22*b*.

The DC output provided by universal power supply circuit 30 is also provided to DC-to-DC converter 32, which further reduces the magnitude of the DC voltage (e.g., 12V to 5V) for used to power the remainder of the components employed by auto-volt comparator circuit 20. For example, the DC output provided by DC-to-DC converter 32 powers components such as operational amplifier 38, window comparator circuit 40, and timer circuit 44.

Timer circuit 40 is connected to receive DC voltage provided by DC-to-DC converter 32. In this embodiment, timer circuit 50 is an integrated circuit (e.g., 555 circuit) that is programmed with a threshold value that must be exceeded by the voltage provided across resistor R5 and capacitor C3 before the output of timer circuit 50 is activated. The output of timer circuit 50 is provided as an input to relays 42*a* and 42*b*, thereby allowing the relays to be selectively activated by window comparator circuit 40. This delay allows times for all signals to settle within auto-volt comparator circuit 20, such that transients at start-up do not result in a mistake identifying the magnitude of the power source and a corresponding mistake regarding the tapped position of transformer T2. The time delay is set or modified based on the programmed value of timer circuit 44 and the respective values of resistor R5 and capacitor C3. In this embodiment, these values are selected to provide a delay of approximately 1-2 seconds.

The stepped-down input voltage provided as an input to auto-volt comparator circuit 20 is also provided to bridge rectifier 34, which includes a plurality of diodes arranged to convert the AC stepped-down voltage to a rectified output. Voltage divider 36—comprised of resistors R1 and R2—reduces the magnitude of the rectified voltage and capacitor C1 provides smoothing to provide a rectified output voltage. Operational amplifier 38 is a high-impedance circuit that acts to generate the same voltage provided at the input of the amplifier, but with additional current. In this way, operational amplifier 38 provides a stable output for analysis by window comparator 40.

The output of operational amplifier 38, the voltage of which is proportional to the voltage provided at the input of input adaptable test set 10, is provided to window comparator circuit 40 to determine the magnitude of the power source connected to input adaptable test set 10. Window comparator circuit 40 includes programmed trip points (i.e., reference points) that are compared with the input voltage. For example, in the embodiment shown in FIG. 2 reference points are set at one volt and three volts. If the input voltage provided to window comparator circuit 40 is between one and three volts, then the comparator circuit determines that the source voltage is 208 VAC and switches 'on' transistor Q1. This causes relay 42*a* to be energized, which in turn energizes relay 22*a* to select a tapped position of main transformer T1 (as shown in FIG. 1) suited to the identified input voltage. If the input voltage provided to window comparator circuit 40 is greater than three volts, then the comparator circuit determines that the source voltage is 480 VAC and switches 'on' transistor Q2. This causes relay 42*b* to be energized, which in turn energizes relay 22*b* to select a tapped position of main transformer T1 suited to the identified input voltage.

In the embodiment shown in FIG. 2, the comparator circuit is a window comparator (i.e., averages the input over a window and compares the averaged value to the thresholds) that prevents fluctuations in the monitored voltage—either due to the connection of loads or other transients—from causing chatter or fluctuations in the configuration of the main transformer.

The test set according to the present invention provides for the automatic detection of the power source connected to the test set, as well as automatic configuration of the test set to accommodate the identified power source. The invention has been described with respect to embodiments implemented with analog circuits, but the functions performed by the analog components could be replicated with a combination of hardware (e.g., microprocessor, FPGA, etc.) and software for identifying the power source and selectively configuring the main transformer based on the identified power source.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, while the present invention has been described with respect to electrical test equipment, the invention is applicable to other electrical equipment in which the equipment must be capable of adapting to various input sources.

The invention claimed is:

1. An input adaptable electrical device comprising:

an input for receiving an input voltage from an unidentified power source;

a main transformer having a primary winding and a secondary winding, the primary winding of the main transformer connected to receive the input voltage from the input, the primary winding of the main transformer having first, second and third transformer taps that allow the main transformer to be configured in a first configuration or a second configuration;

a circuit breaker connected between the input and the primary winding of the main transformer, when 'open' the circuit breaker prevents the input voltage from being provided to the primary winding of the main transformer and when 'closed' the circuit breaker allows the input voltage to be provided to the primary winding of the main transformer; and an automatic input voltage detection circuit connected to monitor the input voltage provided by the unidentified power source, wherein the automatic input voltage detection circuit identifies the power source based on the monitored input voltage, and selects the first configuration or the second configuration of the main transformer based on the identification of the power source, the automatic input voltage detection circuit including:

a step-down transformer having a primary winding and a secondary winding, the primary winding connected to the input to receive the input voltage;

a first relay connected to the second tap of the main transformer, the first relay being energized to selectively configure the main transformer in the first configuration;

a second relay connected to the third tap of the main transformer, the second relay being energized to selectively configure the main transformer in the second configuration; and an auto-volt comparator circuit connected to monitor a stepped-down voltage provided by the secondary winding of the step-down transformer that is representative of the input power, wherein the auto-volt comparator circuit identifies the power source based on the stepped-down voltage and in response selectively energizes either the first relay or the second relay to configure the main transformer.

2. The device of claim 1, wherein the automatic input voltage detection circuit provides a visual indication of the identified power source.

3. The device of claim 1, further including:

a first visual indicator activated by the auto-volt comparator circuit in response to the first relay being energized; and a second visual indicator activated by the auto-volt comparator circuit in response to the second relay being energized.

4. The device of claim 1, wherein the auto-volt comparator circuit includes:

a universal power supply connected to generate a first direct-current (DC) voltage based on the stepped-down voltage, the first DC voltage providing operational power to the auto-volt comparator circuit; wherein the value of the DC voltage is independent of a magnitude of the stepped-down voltage;

a rectifier circuit connected to generate a second DC voltage based on the stepped-down voltage, a comparator circuit that compares the second DC voltage to threshold values to identify the power source, the second DC voltage being proportional to a magnitude of the voltage provided by the power source.

5. The device of claim 4, further including:

a third relay connected to energize the first relay by communicating the first DC voltage to the first relay, wherein the third relay is selectively energized by the comparator circuit based on the identified power source; and a fourth relay connected to energize the second relay by communicating the first DC voltage to the second relay, wherein the fourth relay is selectively energized by the comparator circuit based on the identified power source.

6. An input adaptable test set comprising:

an input for receiving an unknown input voltage;

a main transformer having a primary winding and a secondary winding, the primary winding connected to the input through an input circuit breaker that when 'open' prevents application of the unknown input voltage to the primary winding and when 'closed' allows application of the unknown input voltage to the primary winding, the primary winding have a first tap, a second tap and third tap that allows the main transformer to be configured in a first state or a second state;

a first relay connected to the second tap of the transformer, wherein when energized the first relay connects the main transformer in the first state;

a second relay connected to the third tap of the transformer, wherein when energized the second relay connects the main transformer in the second state;

a step-down transformer having a primary winding and a secondary winding, the primary winding connected to the input and configured to step down the unknown input voltage at the secondary winding; and an auto-volt comparator circuit connected to the secondary winding of the step-down transformer that identifies the power source based on a stepped-down voltage provided by the step-down transformer, wherein the comparator circuit selectively energizes either the first relay or the second relay to configure the main transformer based on the identification of the power source.

7. The input adaptable test set of claim 6, wherein the auto-volt comparator circuit includes:

a universal power supply connected to generate a first direct-current (DC) voltage based on the stepped-down voltage, the first DC voltage providing operational power to the auto-volt comparator circuit; wherein the value of the DC voltage is constant over a range of inputs associated with the stepped-down voltage;

a rectifier circuit connected to generate a second DC voltage based on the stepped-down voltage, a comparator circuit that compares the second DC voltage to threshold values to identify the power source, the second DC voltage being proportional to a magnitude of the voltage provided by the power source.

8. The input adaptable test set of claim 7, further including:

a timer circuit that delays energization of either the first relay or the second relay for a period of time following application of power to the auto-volt comparator circuit.

9. The input adaptable test of claim 8, wherein the comparator circuit is a window comparator that averages the second DC voltage over a period of time and compares the average to the threshold values to identify the power source.

* * * * *